(12) United States Patent
Ikoshi et al.

(10) Patent No.: US 8,148,752 B2
(45) Date of Patent: Apr. 3, 2012

(54) FIELD EFFECT TRANSISTOR

(75) Inventors: Ayanori Ikoshi, Kyoto (JP); Shingo Hashizume, Kyoto (JP); Masahiro Hikita, Toyama (JP); Hiroto Yamagiwa, Hyogo (JP); Manabu Yanagihara, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/021,118

(22) Filed: Feb. 4, 2011

(65) Prior Publication Data

US 2011/0215379 A1 Sep. 8, 2011

(30) Foreign Application Priority Data

Mar. 2, 2010 (JP) ................................ 2010-045440

(51) Int. Cl.
*H01L 29/778* (2006.01)
(52) U.S. Cl. ....................................................... 257/194
(58) Field of Classification Search .................. 257/194, 257/192, 285, E29.246–E29.254, 20, 274, 257/E29.312, E21.148–E29.149, E29.265, 257/E29.32, E21.371, 93–95, 102, 104, 188, 257/E21.086, E21.097–E21.1, E21.108–E21.113, 257/E21.117–E21.118; 257/E31.067, E31.08, 257/E29.188, E29.243, E29.247, E29.248, 257/E29.252, E29.253, E29.311, E29.314–E29.315, 257/E21.093, E21.103, E21.116, 9, 11, 12, 257/37, 51, 85, 90, 94, 96; 257/183, 196, 257/200, E51.01, E51.011, E51.014, E51.015, 257/E51.017, E51.028, E51.029, E51.049, 257/E33.016, E33.021, E33.027, E33.032, 257/E33.034, E33.048, E31.005, E31.007, 257/E31.064; 438/189, 285, 603–604, 606, 438/930–933, 46, 47, 77, 84, 167, 172
See application file for complete search history.

(56) References Cited

U.S. PATENT DOCUMENTS

| 5,111,256 | A | 5/1992 | Ohata et al. | |
|---|---|---|---|---|
| 2008/0023727 | A1 | 1/2008 | Hoshi et al. | |
| 2008/0087915 | A1* | 4/2008 | Uemoto et al. | 257/192 |
| 2008/0087916 | A1* | 4/2008 | Amasuga et al. | 257/194 |
| 2008/0121876 | A1 | 5/2008 | Otsuka et al. | |
| 2010/0097105 | A1 | 4/2010 | Morita et al. | |
| 2010/0301347 | A1* | 12/2010 | Chung et al. | 257/76 |

FOREIGN PATENT DOCUMENTS

JP 2007-027284 2/2007

* cited by examiner

*Primary Examiner* — Dao H Nguyen
*Assistant Examiner* — Tram H Nguyen
(74) *Attorney, Agent, or Firm* — McDermott Will & Emery LLP

(57) ABSTRACT

A field effect transistor includes a semiconductor stack formed on a substrate, and having a first nitride semiconductor layer and a second nitride semiconductor layer. A source electrode and a drain electrode are formed on the semiconductor stack so as to be separated from each other. A gate electrode is formed between the source electrode and the drain electrode so as to be separated from the source electrode and the drain electrode. A hole injection portion is formed near the drain electrode. The hole injection portion has a p-type third nitride semiconductor layer, and a hole injection electrode formed on the third nitride semiconductor layer. The hole injection electrode and the drain electrode have substantially the same potential.

15 Claims, 12 Drawing Sheets

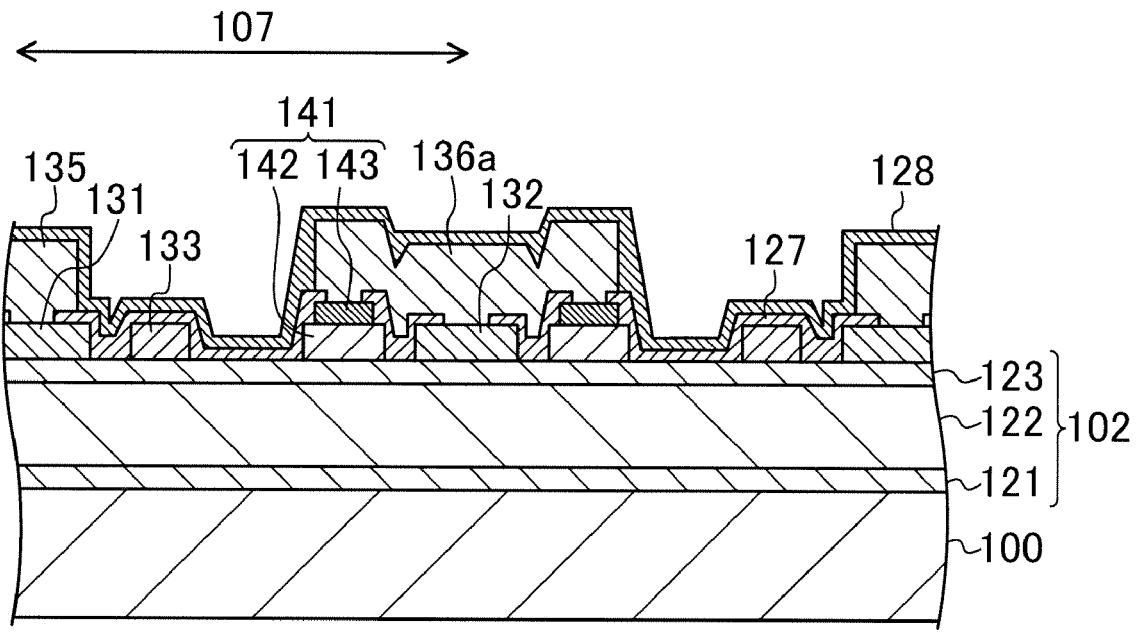
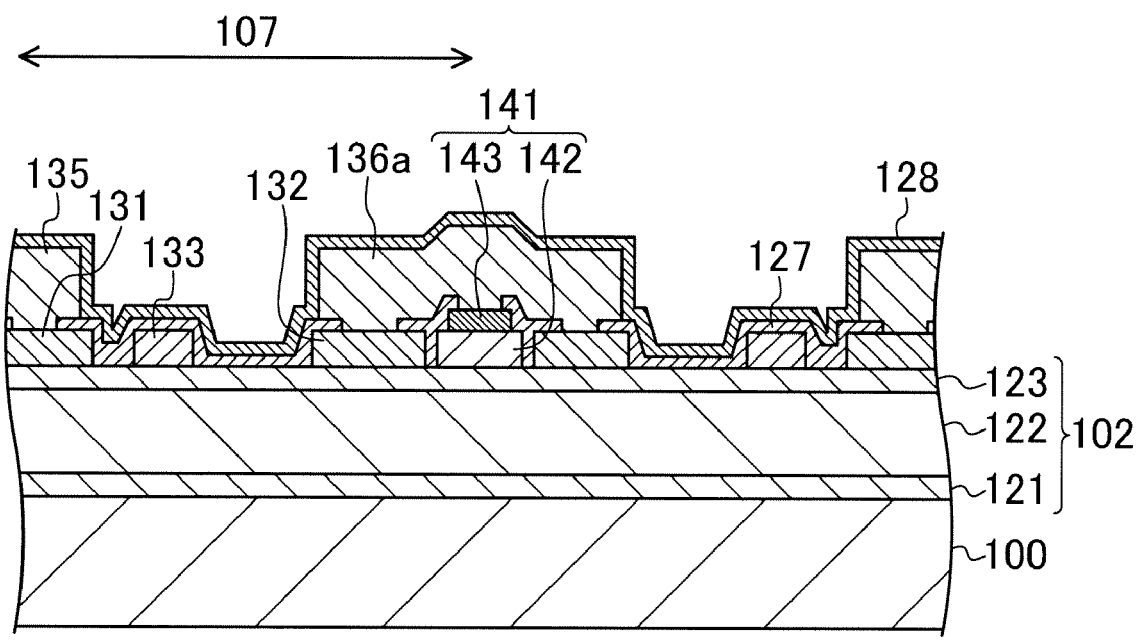

FIELD EFFECT TRANSISTOR

CROSS-REFERENCE TO RELATED APPLICATION

This application claims priority to Japanese Patent Application No. 2010-045440 filed on Mar. 2, 2010, the disclosure of which including the specification, the drawings, and the claims is hereby incorporated by reference in its entirety.

BACKGROUND

The present disclosure relates to field effect transistors (FETs), and more particularly to transistors using nitrides, which are used for inverters, power supply circuits, etc.

Group III-V nitride compound semiconductors such as gallium nitride (GaN), which are generally called nitride semiconductors, have received attention. The nitride semiconductors are compound semiconductors that are formed by aluminum (Al), gallium (Ga), and indium (In) as group III elements and nitrogen (N) as a group V element, and is represented by the general formula $In_xGa_yAl_{1-x-y}N$ (where $0 \leq x \leq 1$, $0 \leq y \leq 1$, and $x+y \leq 1$). The nitride semiconductors can form various alloys, and can easily form a heterojunction interface. The heterojunctions of the nitride semiconductors are characterized in that a high density two-dimensional electron gas (2DEG) layer is formed near the junction interface due to spontaneous polarization or piezoelectric polarization even in a non-doped state. FETs using this high density 2DEG layer as carriers have received attention as high frequency and high power devices.

However, a phenomenon called "current collapse" tends to occur in the FETs using nitride semiconductors. The current collapse is a phenomenon in which a current decreases for a certain period of time when the device is turned on again after being turned off. Poor characteristics regarding the current collapse make high speed switching operations difficult, causing a very serious problem in the device operation.

One method to reduce the current collapse is to form a protective film on the surface of an electron supply layer. An example of the protective film is a silicon nitride film (a SiN film) or a p-type organic semiconductor film (see, e.g., Japanese Patent Publication No. 2007-27284).

SUMMARY

However, it was found that reducing the current collapse by forming a protective film has the following problem. In the case where the SiN film is used as the protective film, the SiN film makes it difficult for carriers to be trapped in the surface levels. However, since the carriers trapped in the surface levels cannot be eliminated, the current collapse cannot be sufficiently reduced.

In the case where the p-type organic semiconductor film is used as the protective film, the p-type organic semiconductor film is expected to limit trapping of carriers in the surface levels and to eliminate the trapped carriers. However, since the organic semiconductor film needs to be formed by a resistance heating vapor deposition method, a spin-off method, or the like, it is more difficult to form a uniform film as compared to the SiN film that is formed by a chemical vapor deposition (CVD) method or the like. Thus, the interface between the organic semiconductor film and the electron supply layer is unstable, whereby the organic semiconductor layer does not function well as the protective film.

It is an object of the present disclosure to solve the above problems, and to enable an FET using nitride semiconductor, in which current collapse is reduced, to be easily implemented.

In order to achieve the above object, an example FET is configured to include a hole injection portion that is formed near a drain electrode.

Specifically, an example FET includes: a semiconductor stack formed on a substrate, and having a first nitride semiconductor layer, and a second nitride semiconductor layer formed on the first nitride semiconductor layer and having a wider bandgap than that of the first nitride semiconductor layer; a source electrode and a drain electrode, which are formed on the semiconductor stack so as to be separated from each other; a gate electrode formed between the source electrode and the drain electrode so as to be separated from the source electrode and the drain electrode; and a hole injection portion formed on the semiconductor stack at a position closer to the drain electrode than to the gate electrode. The hole injection portion has a p-type third nitride semiconductor layer, and a hole injection electrode formed on the third nitride semiconductor layer. The hole injection electrode and the drain electrode have substantially a same potential.

In the example FET, holes are injected from the hole injection portion into a 2DEG layer when the FET is turned on. The injected holes recombine with electrons trapped in the surface levels or the like. Since the electrons trapped in the surface levels or the like, which cause the current collapse, can be eliminated, the current collapse can be reduced.

BRIEF DESCRIPTION OF THE DRAWINGS

FIG. 7 is a cross-sectional view taken along line VII-VII in FIG. 6.

FIG. 8 is a cross-sectional vie showing a modification of the FET according to the embodiment.

DETAILED DESCRIPTION

Figure 1:
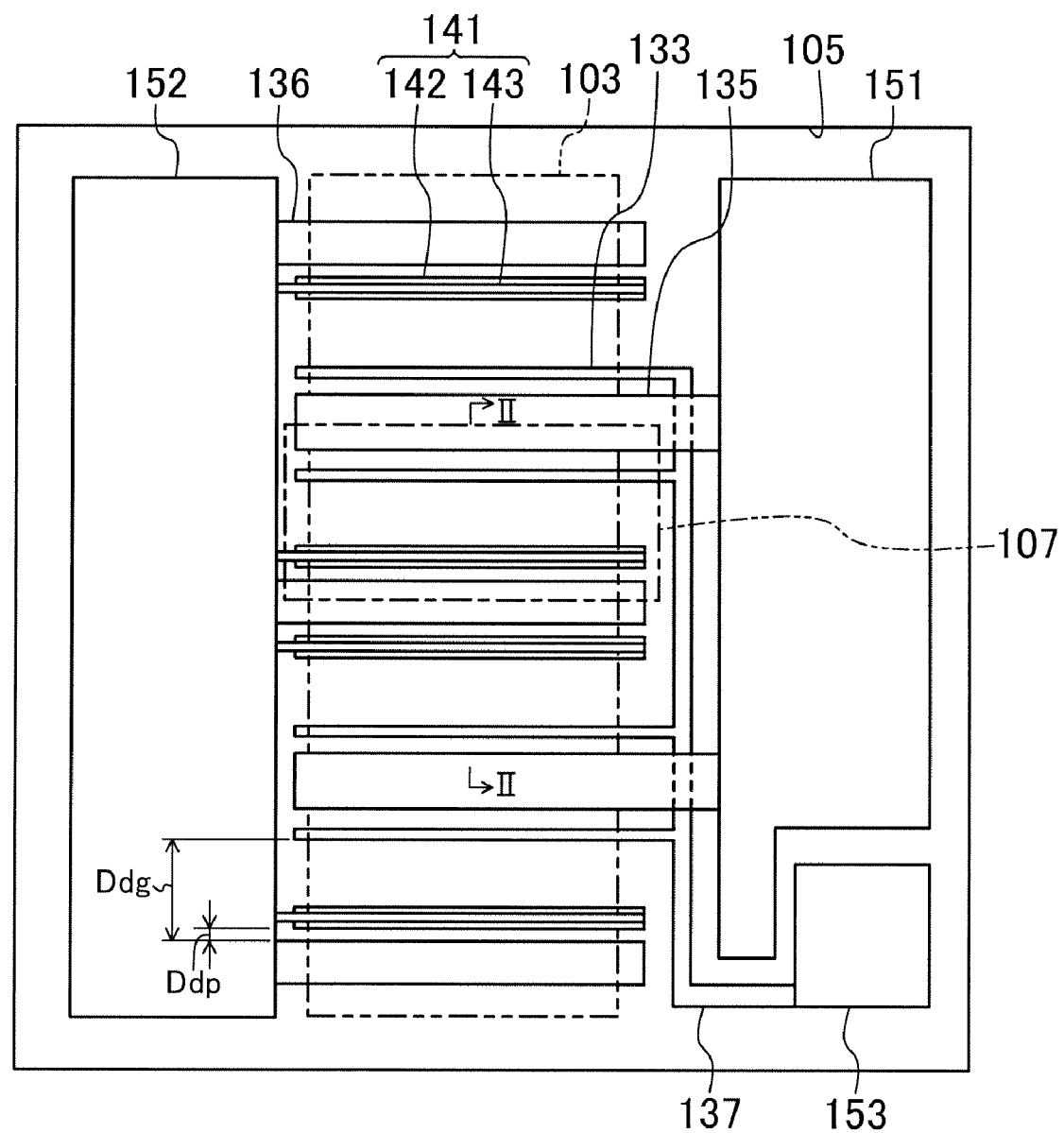
FIG. 1 is a plan view of an FET according to an embodiment.
Figure 2:
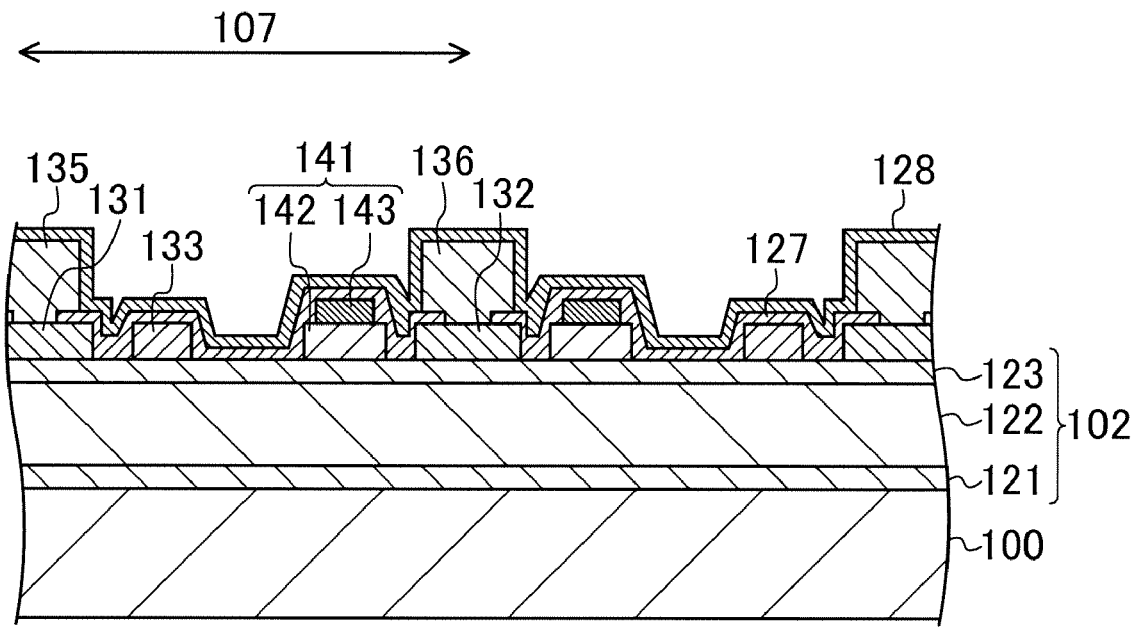
FIG. 2 is a cross-sectional view taken along line II-II in FIG. 1.

FIG. 1 shows a planar configuration of a field effect transistor (FET) according to an embodiment. FIG. 2 shows a cross-sectional configuration taken along line II-II in FIG. 1. As shown in FIGS. 1-2, the FET of the present embodiment is a multi-finger FET. An active region 103, which is surrounded by an element isolation region 105, is formed in a semiconductor stack 102. Finger-shaped source electrodes 131 and finger-shaped drain electrodes 132 are alternately formed over the active region 103. A finger-shaped gate electrode 133 is formed between each pair of the source electrode 131 and the drain electrode 132.

Each set of the source electrode 131, the gate electrode 133, and the drain electrode 132 forms a unit 107 of the FET. Adjoining ones of the units 107 share the source electrode 131 or the drain electrode 136. The source electrodes 131 of the units 107 are connected in parallel, the drain electrodes 136 of the units 107 are connected in parallel, and the gate electrodes 133 of the units 107 are connected in parallel, thereby forming one FET as a whole. In each unit 107, a hole injection portion 141 is formed between the drain electrode 132 and the gate electrode 133.

The semiconductor stack 102 has a first nitride semiconductor layer 122 formed on a silicon substrate 100 with a buffer layer 121 interposed therebetween, and a second nitride semiconductor layer 123 formed on the first nitride semiconductor layer 122. The first nitride semiconductor layer 122 is a channel layer where electrons move, and is, e.g., an undoped gallium nitride (GaN) layer having a thickness of about 1-2 µm. The second nitride semiconductor layer 123 is an electron supply layer, and is, e.g., an undoped aluminum gallium nitride (AlGaN) layer having a thickness of about 15-50 nm. Note that the term "undoped" means that no impurity has been intentionally introduced into the layer.

The source electrode 131 and the drain electrode 132 can be, e.g., stacks of titanium (Ti) and aluminum (Al). The source electrode 131 and the drain electrode 132 need only form an ohmic contact with a channel that is made of a two-dimensional electron gas (2DEG) layer formed near the interface of the first nitride semiconductor layer 122 with the second nitride semiconductor layer 123. The gate electrode 133 can be, e.g., a stack of nickel (Ni) and gold (Au). The gate electrode 133 need only form a Schottky junction with the channel. Note that the source electrode 131 and the drain electrode 132 may have a recess structure that is in direct contact with the 2DEG layer.

The hole injection portion 141 has a p-type third nitride semiconductor layer 142 selectively formed on the second nitride semiconductor layer 123, and a hole injection electrode 143 formed on the third nitride semiconductor layer 142. The third nitride semiconductor layer 142 is, e.g., a GaN layer doped with magnesium (Mg). The Mg concentration is about $1 \times 10^{19}$ cm$^{-3}$, and the carrier density is about $1 \times 10^{18}$ cm$^{-3}$. The third nitride semiconductor layer 142 can be formed by forming a nitride semiconductor layer on the entire surface of the second nitride semiconductor layer 123 and removing an unwanted part of the nitride semiconductor layer by an inductively coupled plasma (ICP) etching method using chlorine gas. The hole injection electrode 143 is made of, e.g., palladium, and forms an ohmic contact with the third nitride semiconductor layer 142.

A first protective film 127, which is made of silicon nitride ($Si_3N_4$), is formed over the second nitride semiconductor layer 123 so as to cover the source electrode 131, the drain electrode 132, the gate electrode 133, and the hole injection portion 141. A source electrode interconnect 135 is formed over the source electrode 131. The source electrode interconnect 135 is connected to the source electrode 131 via an opening formed in the first protective film 127. The first protective film 127 can be formed by a chemical vapor deposition (CVD) method, and the opening can be formed by a dry etching method using chlorine gas or the like. A drain electrode interconnect 136 is formed over the drain electrode 132. The drain electrode interconnect 136 is connected to the drain electrode 132 via an opening formed in the first protective film 127. A second protective film 128, which is made of $Si_3N_4$, is formed over the first protective film 127 so as to cover the source electrode interconnect 135 and the drain electrode interconnect 136. The second protective film 128 can be formed by a CVD method.

A source electrode pad 151, a drain electrode pad 152, and a gate electrode pad 153 are formed over the element isolation region 105. The source electrode pad 151 is connected to the source electrodes 131 via the source electrode interconnects 135. The drain electrode pad 152 is connected to the drain electrodes 132 via the drain electrode interconnects 136. The gate electrode pad 153 is connected to the gate electrodes 133 via a gate electrode interconnect 137 that is formed integrally with the gate electrodes 133. The drain electrode pad 152 is connected to the hole injection electrodes 143. Thus, the drain electrodes 132 are connected to the hole injection electrodes 143.

The operation of the FET of the present embodiment will be described below. Current collapse is considered to be caused by electrons trapped in the surface levels. In conventional FETs having no hole injection portion 141, the 2DEG layer between the gate electrode 133 and the drain electrode 132 is depleted by electrons trapped in the surface levels of the second nitride semiconductor layer 123 or the like, if a drain bias as high as about several tens of volts is applied to the drain electrode when the FET is off. Since it takes more time to release the electrons trapped in the surface levels than to trap electrons, the depletion layer spreads between the gate electrode 133 and the drain electrode 132 even immediately after the gate is turned on. Thus, the channel is not completely open, and the channel resistance increases.

On the other hand, the FET of the present embodiment has the hole injection portions 141. The hole injection portion 141 has the p-type third nitride semiconductor layer 142, and the hole injection electrode 143 that forms an ohmic contact with the third nitride semiconductor layer 142. The hole injection electrode 143 is connected to the drain electrode 132, and the hole injection electrode 143 and the drain electrode 132 have substantially the same potential. Thus, when the FET is turned on, holes are injected from the p-type third nitride semiconductor layer 142 toward the 2DEG layer. The injected holes recombine with the electrons trapped at the surface of the second nitride semiconductor layer 123 or in the second nitride semiconductor layer 123 in the off state. Thus, the depletion layer does not spread in the 2DEG layer, and an increase in channel resistance can be reduced.

The hole injection portion 141 need only be able to inject holes so that the holes recombine with the electrons trapped in the surface levels or the like between the drain electrode 132 and the gate electrode 133. Thus, in the present embodiment, the third nitride semiconductor layer 142 contains p-type impurities. The p-type impurities can be, e.g., magnesium (Mg), and the Mg concentration can be in the range from about $1 \times 10^{-18}$ cm$^{-3}$ to about $1 \times 10^{-21}$ cm$_{-3}$. The thickness of the third nitride semiconductor layer 142 can be in the range from about 50 nm to about 300 nm, and is preferably in the range from about 150 nm to about 250 nm. The width of the third nitride semiconductor layer 142 can be in the range from about 1 µm to about 3 µm, and preferably in the range from about 1.5 µm to about 2.5 µm, depending on the distance between the drain electrode 132 and the gate electrode 133.

Figure 3:
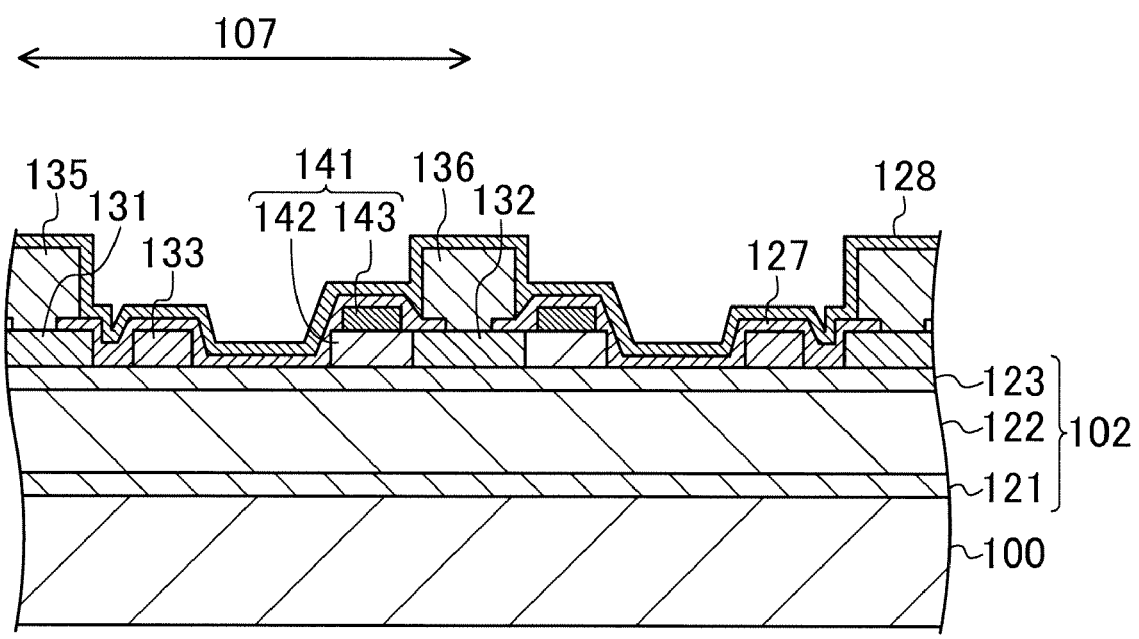
FIG. 3 is a cross-sectional view showing a modification of the FET according to the embodiment.

The hole injection portion 141 can be provided at any position between the drain electrode 132 and the gate electrode 133. Note that a voltage that is substantially equal to that of the drain electrode 132 is applied to the hole injection electrode 143. Thus, the gate-drain breakdown voltage decreases as the gap between the hole injection portion 141 and the gate electrode 133 decreases. Thus, it is preferable that the gap Ddp between the drain electrode 132 and the third nitride semiconductor layer 142 be less than 30% of the gap Ddg between the drain electrode 132 and the gate electrode 133. For example, if Ddg is about 10 µm, it is preferable that Ddp be less than about 3 µm. In view of the lithography accuracy or the like, the drain electrode 132 and the third nitride semiconductor layer 142 can be more easily formed if they are separated from each other. However, as shown in FIG. 3, a side surface of the drain electrode 132 may be in contact with a side surface of the third nitride semiconductor layer 142. In FIGS. 1-2, the hole injection portion 141 may be formed between the drain electrode 132 and the source electrode pad 151. The hole injection portion 141 may be formed between the drain electrode 132 and the source electrode pad 151 and between the drain electrode 132 and the drain electrode pad 152 so as to surround the drain electrode 132.

Figure 4:
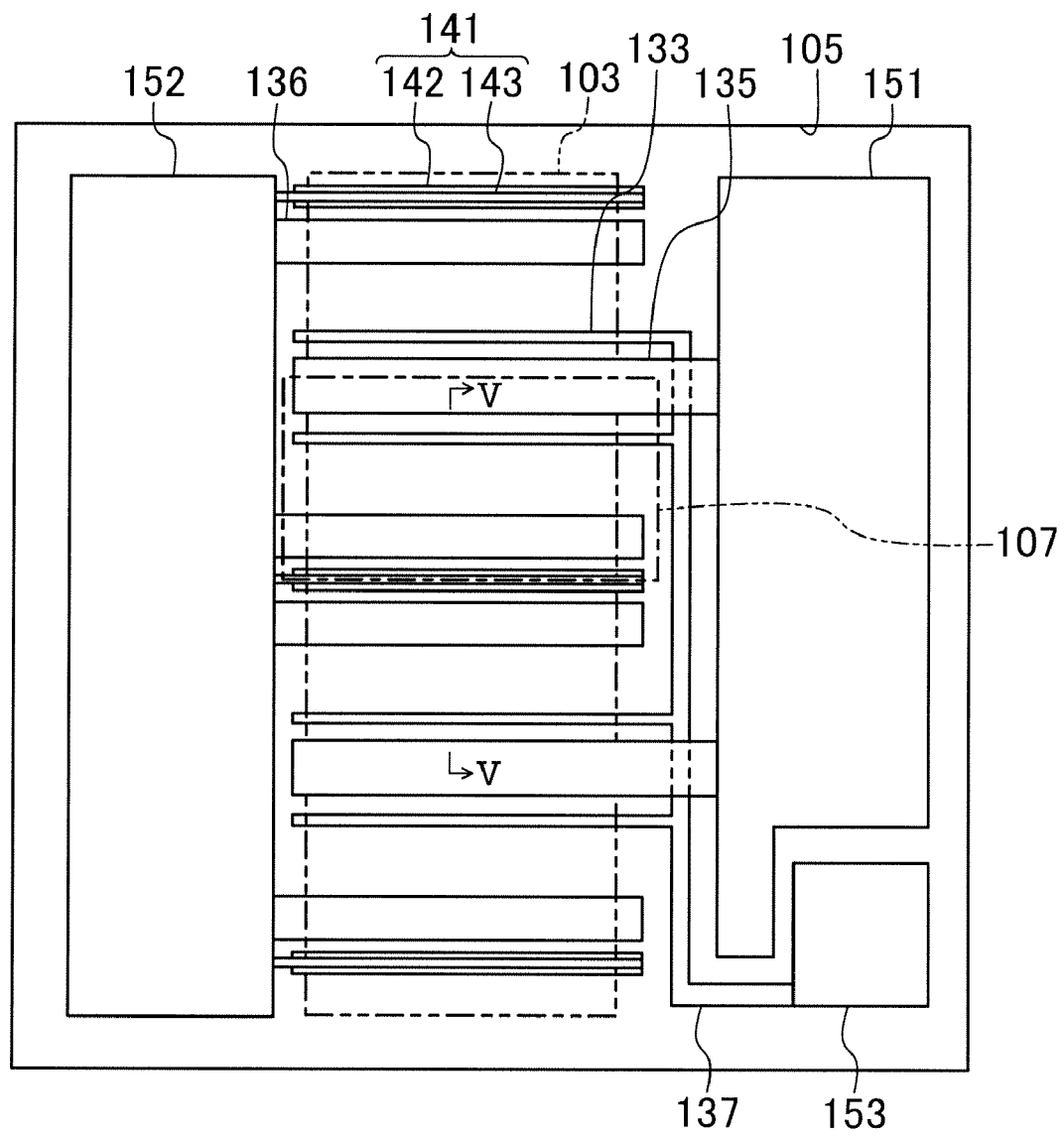
FIG. 4 is a plan view showing a modification of the FET according to the embodiment.
Figure 5:
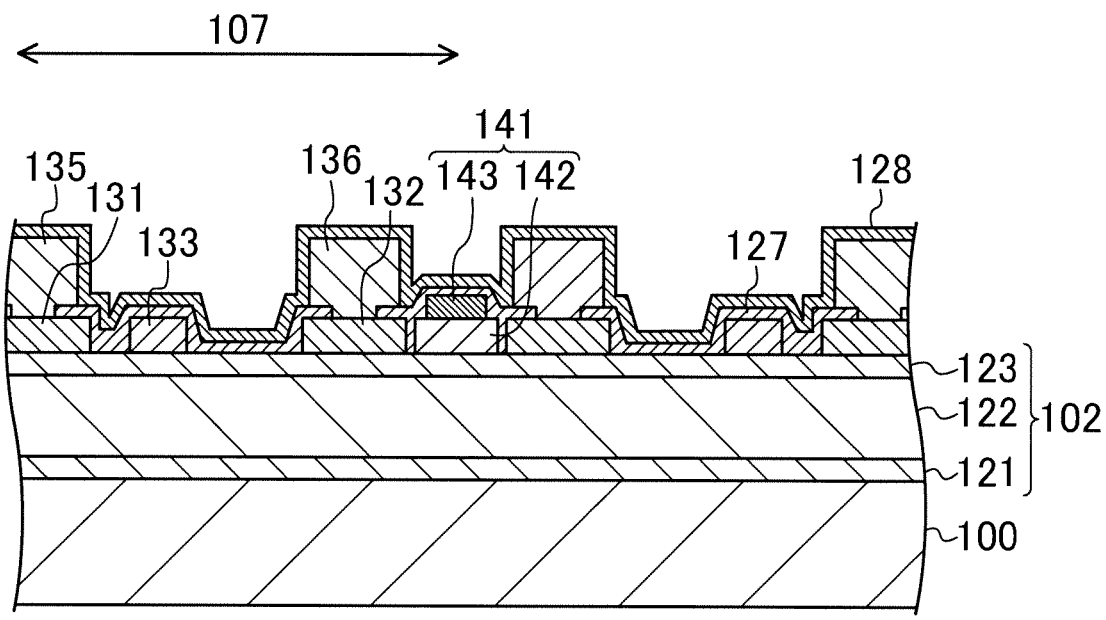
FIG. 5 is a cross-sectional view taken along line V-V in FIG. 4.

The hole injection portion 141 need not necessarily be formed between the gate electrode 133 and the drain electrode 132. As shown in FIGS. 4-5, the hole injection portion 141 may be formed on the opposite side of the drain electrode 132 from the gate electrode 133. If the hole injection portion 141 is formed between the drain electrode 132 and the gate electrode 133, the carrier density in the channel can locally decrease due to the hole injection portion 141, and the on-resistance can increase. However, if the hole injection portion 141 is formed on the opposite side from the gate electrode 133, the influence of the hole injection portion 141 on the channel reduces. Thus, the on-resistance can be reduced as compared to the case where the hole injection portion 141 is provided between the drain electrode 132 and the gate electrode 133.

In the case where the hole injection portion 141 is formed on the opposite side from the gate electrode 133 in the multi-finger FET, adjoining ones of the units 107 cannot share the drain electrode 132. Thus, the drain electrode 132 need be provided in every unit, but the hole injection portion 141 can be shared by adjoining ones of the units 107.

In the case where the hole injection portion 141 is provided between the gate electrode 133 and the drain electrode 132, the hole injection portion 141 is expected to function as a drain field plate that reduces the electric field strength at the end of the drain electrode 132. Reducing the electric field strength at the end of the drain electrode 132 is effective in reducing the current collapse.

The hole injection electrode 143 may have any potential that enables holes to be supplied from the third nitride semiconductor layer 142 when the FET is turned on. Specifically, the potential of the hole injection electrode 143 need only be the same as that of the drain electrode 132. In the case where the hole injection electrode 143 is connected to the drain electrode 132 via a conductive interconnect, the potential of the hole injection electrode 143 can be slightly different from that of the drain electrode 132 due to the resistance of the conductive interconnect. Thus, in this case, the "hole injection electrode 143 and the drain electrode 132 have the same potential" means that the hole injection electrode 143 and the drain electrode 132 have substantially the same potential. That is, the expression "the hole injection electrode 143 and the drain electrode 132 have the same potential" includes not only the case where the hole injection electrode 143 and the drain electrode 132 have exactly the same potential, but also the case where the potential of the hole injection electrode 143 is slightly different from that of the drain electrode 132 due to the resistance of the conductive interconnect.

Figure 6:
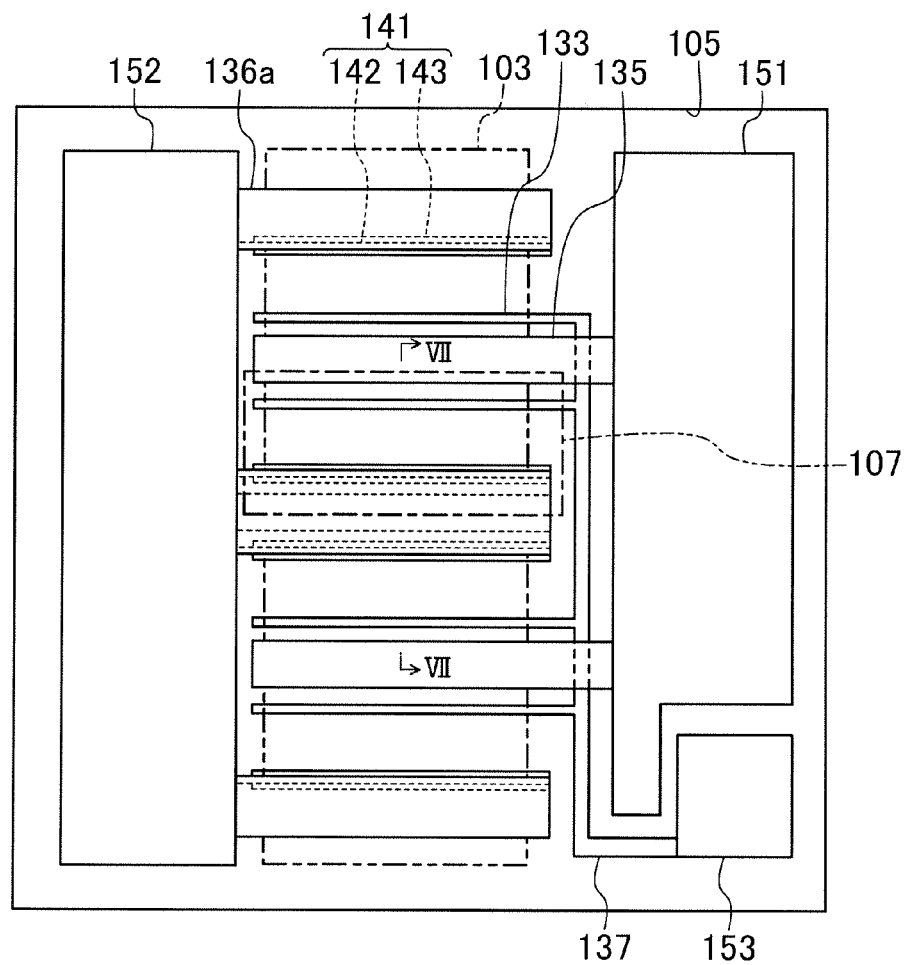
FIG. 6 is a plan view showing a modification of the FET according to the embodiment.

In order to further reduce the difference in potential between the hole injection electrode 143 and the drain electrode 132, a wide drain electrode interconnect 136*a* may be formed so as to cover the drain electrode 132 and the hole injection electrode 143, as shown in FIGS. 6-7. The drain electrode interconnect 136*a* is connected to the hole injection electrode 143 via an opening formed in the first protective film 127. Reduction in on-resistance is desired in FETs using nitride semiconductors. In low on-resistance FETs having on-resistance as low as about 10-100 mΩ, the resistance of drain interconnects also greatly affects the on-resistance. The configuration as shown in FIG. 6 can not only significantly reduce the interconnect resistance between the drain electrode 132 and the hole injection electrode 143, but also reduce the interconnect resistance between the drain electrode pad 152 and the drain electrode 132, and the interconnect resistance between the drain electrode pad 152 and the hole injection electrode 143. Thus, the configuration of FIG. 6 is useful in reducing the on-resistance of FETs.

Note that even in the case where the hole injection portion 141 is provided on the opposite side from the gate electrode 133, the drain electrode interconnect 136*a* may be formed so as to cover the drain electrode 132 and the hole injection electrode 143, as shown in FIG. 8.

Figure 9:
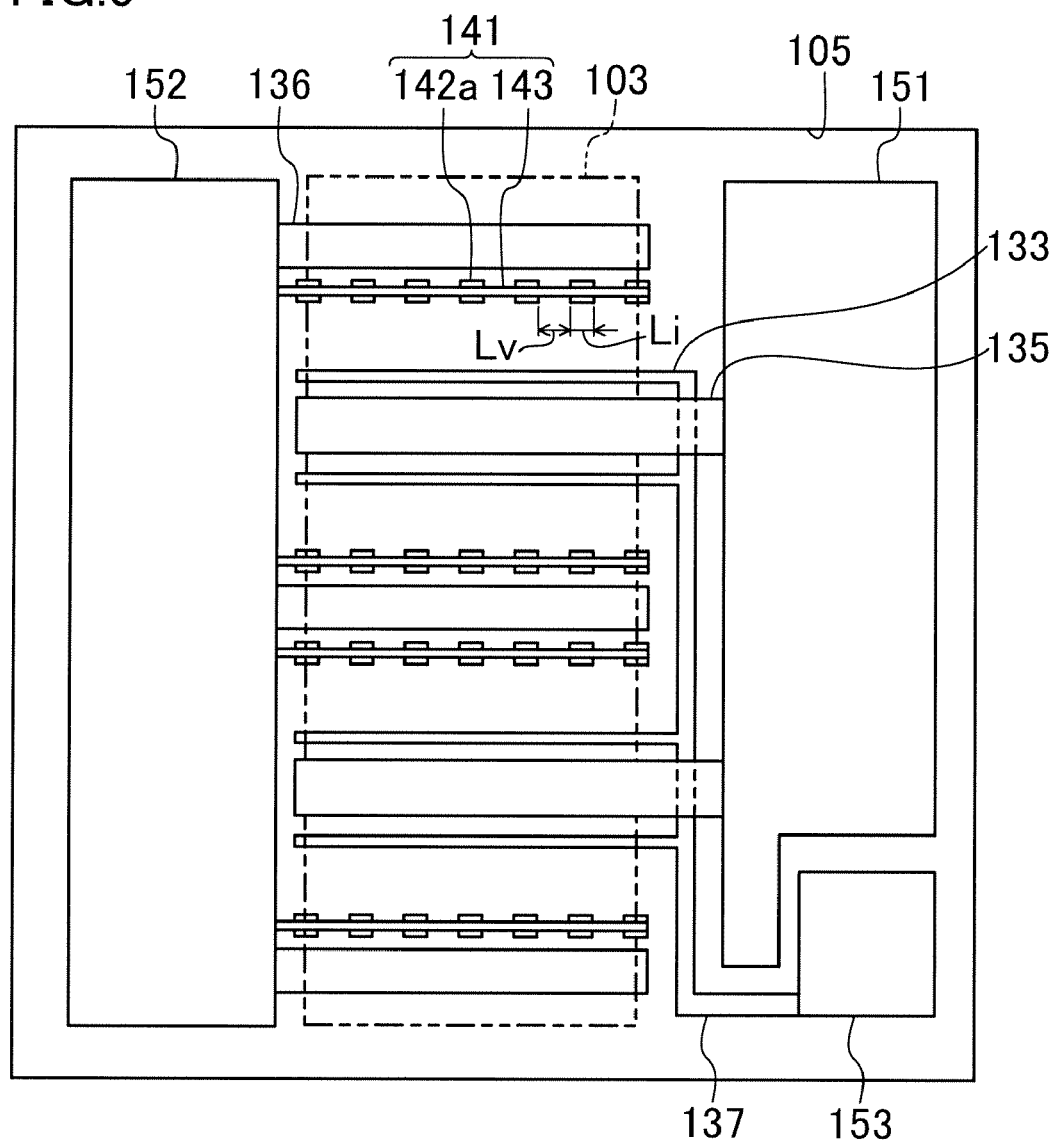
FIG. 9 is a plan view showing a modification of the FET according to the embodiment.
Figure 10:
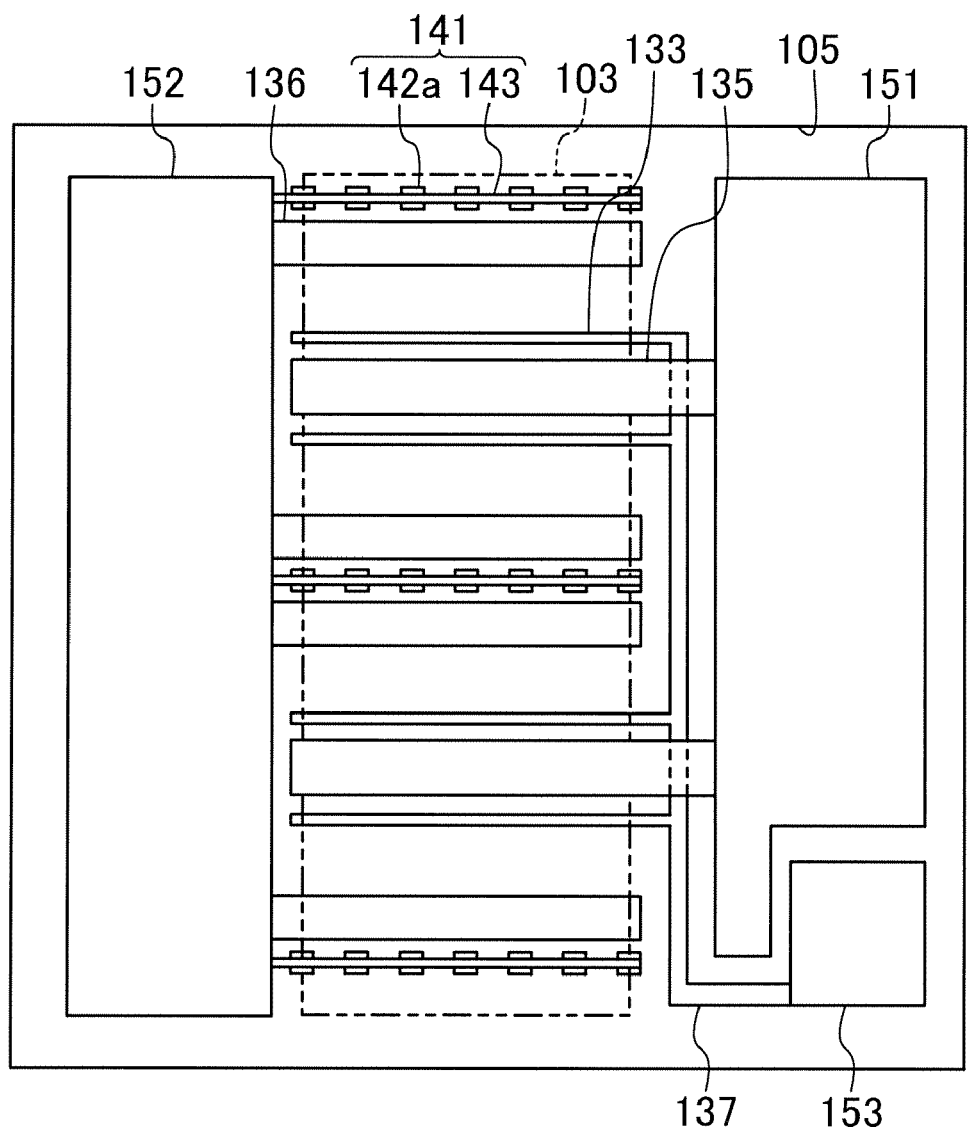
FIG. 10 is a plan view showing a modification of the FET according to the embodiment.

In order to further reduce an increase in on-resistance, the third nitride semiconductor layer 142 may have a discontinuous structure having a plurality of island-shaped portions 142*a*, as shown in FIG. 9. This reduces the supply of holes from the third nitride semiconductor layer 142, whereby an increase in on-resistance can be reduced. In order to reduce an increase in on-resistance, it is preferable to reduce as much as possible the ratio "Li/Lv" of the length "Li" of the side of the island-shaped portion 142*a* which faces the drain electrode 133, to the gap "Lv" between the island-shaped portions 142*a*. The ratio "Li/Lv" can be at least less than 1. However, as the ratio "Li/Lv" decreases, the hole injection portion 141 cannot be expected to function as a drain field plate. In order for the hole injection portion 141 to function well as a drain field plate, it is preferable that the ratio "Li/Lv" be equal to or higher than 1. Note that even in the case where the hole injection portion 141 is provided on the opposite side from the gate electrode 133, the third nitride semiconductor layer 142 may have a discontinuous structure, as shown in FIG. 10. Even in the case where the third nitride semiconductor layer 142 has a discontinuous structure, a wide drain electrode interconnect 136*a* may be formed so as to cover the drain electrode 132 and the hole injection electrode 143. The hole injection portion 141 may be formed so as to surround the drain electrode 132.

Figure 11:
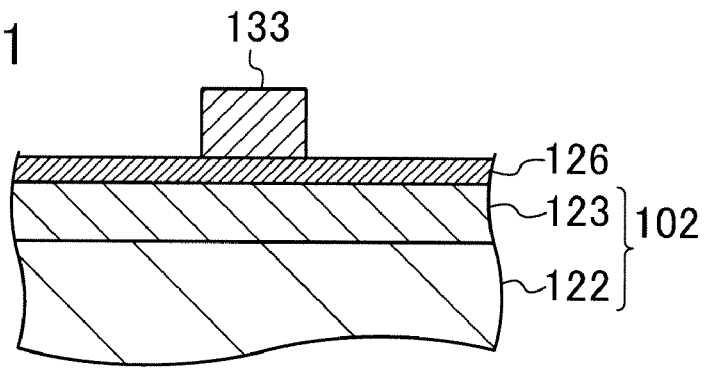
FIG. 11 is a cross-sectional view showing the structure of a gate electrode of the FET according to the embodiment.
Figure 12:
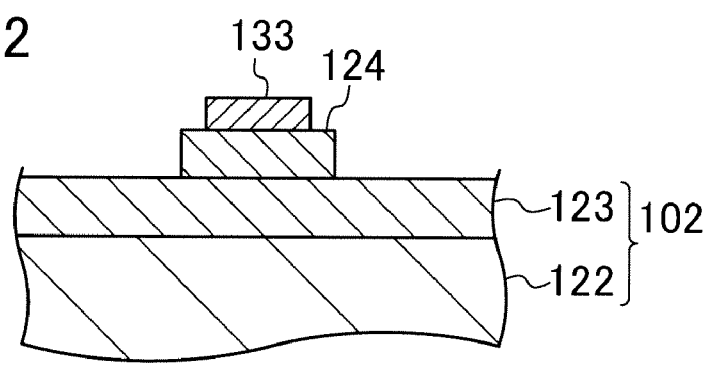
FIG. 12 is a cross-sectional view showing the structure of a gate electrode of the FET according to the embodiment.

The FET of the present embodiment has a metal semiconductor field effect transistor (MESFET) structure in which the gate electrode 133 is in contact with the second nitride semiconductor layer 123. However, the gate electrode 133 may have other structures. For example, as shown in FIG. 11, the FET of the present embodiment may have a metal insulator semiconductor field effect transistor (MISFET) structure in which the gate electrode 133 is formed on the second nitride semiconductor layer 123 with an insulating film 126 interposed therebetween. Alternatively, as shown FIG. 12, the FET of the present embodiment may have an enhancement junction field effect transistor (JFET) structure in which the gate electrode 133 is formed on the second nitride semiconductor layer 123 with a p-type fourth nitride semiconductor layer 124 interposed therebetween. In the case of the enhancement JFET, the gate electrode 133 can be made of a material, such as palladium, which forms an ohmic contact with the fourth nitride semiconductor layer 124.

Figure 13:
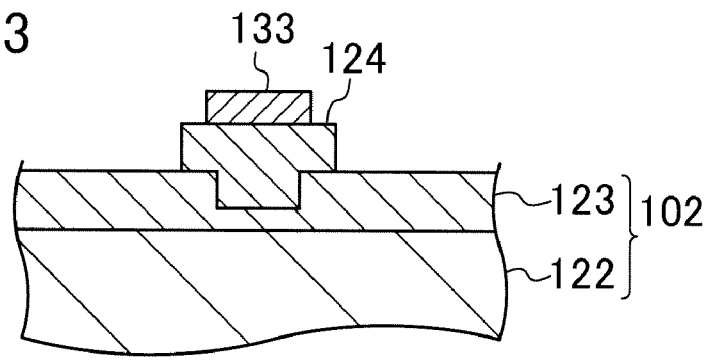
FIG. 13 is a cross-sectional view showing the structure of a gate electrode of the FET according to the embodiment.
Figure 14:
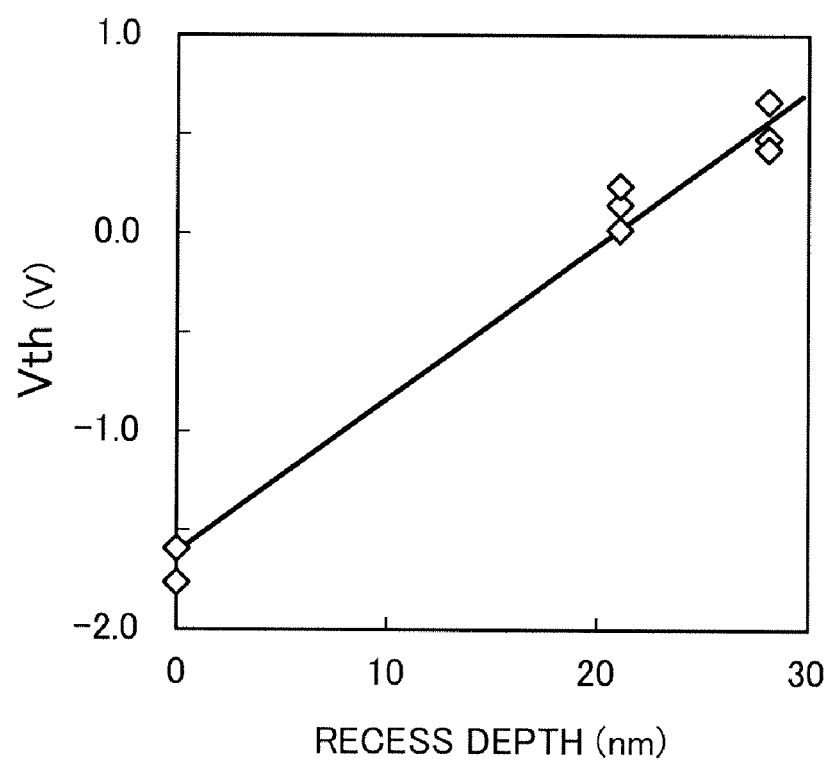
FIG. 14 is a graph showing the relation between the recess depth and the threshold voltage.
Figure 15:
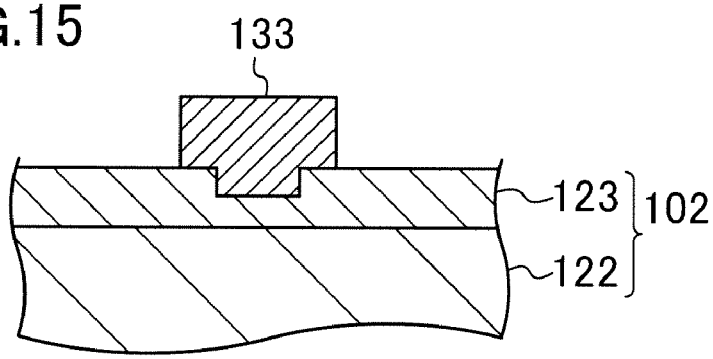
FIG. 15 is a cross-sectional view showing the structure of a gate electrode of the FET according to the embodiment.
Figure 16:
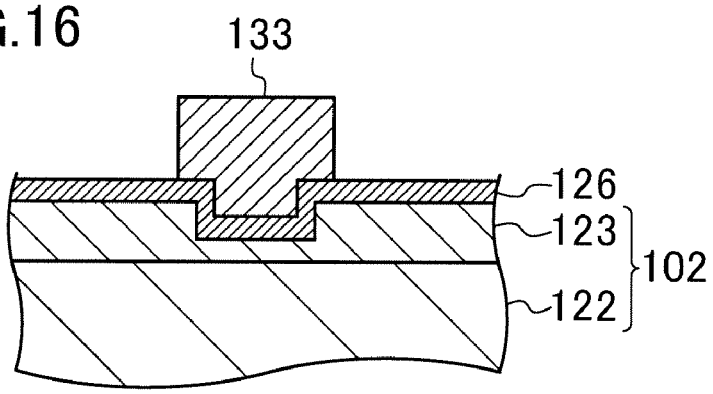
FIG. 16 is a cross-sectional view showing the structure of a gate electrode of the FET according to the embodiment.

In order to further increase the threshold voltage, the fourth nitride semiconductor layer 124 may be formed so as to fill a recess formed in the second nitride semiconductor layer 123, as shown FIG. 13. As shown in FIG. 14, the threshold voltage Vth increases as the recess depth increases. Note that as shown in FIGS. 15-16, such a recess structure may be formed in the case of the MESFET and the MISFET as well. The recess can be formed by a dry etching method using chlorine gas, or the like. In the case of the enhancement JFET, a p-type nitride semiconductor layer can be regrown on the second nitride semiconductor layer 123 having a recess formed therein, and can be selectively removed by a dry etching method using chlorine gas, or the like.

Figure 17:
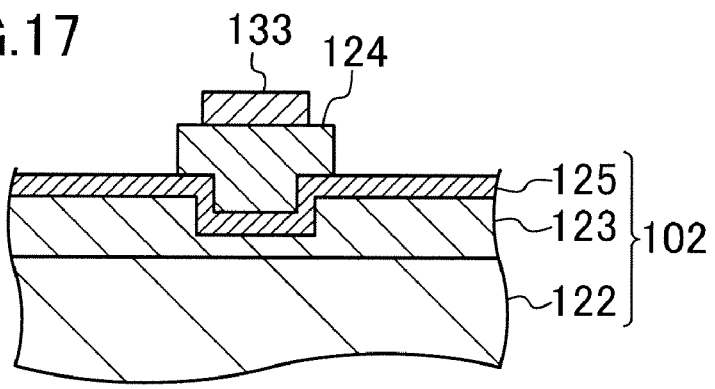
FIG. 17 is a cross-sectional view showing the structure of a gate electrode of the FET according to the embodiment.

As shown in FIG. 17, the fourth nitride semiconductor layer 124 may be formed after forming a thin fifth nitride semiconductor layer 125 on the second nitride semiconductor layer 123. The fifth nitride semiconductor layer 125 can be, e.g., an undoped AlGaN layer having a thickness of about 2-10 nm. Forming the fifth nitride semiconductor layer 125 can reduce the possibility of damage to the second nitride semiconductor layer 123 when selectively etching the p-type nitride semiconductor layer. Moreover, since forming the fifth nitride semiconductor layer 125 increases the distance between the surface of the semiconductor stack 102 and the 2DEG layer, the channel is less susceptible to the surface levels, whereby the current collapse can further be reduced.

Figure 18:
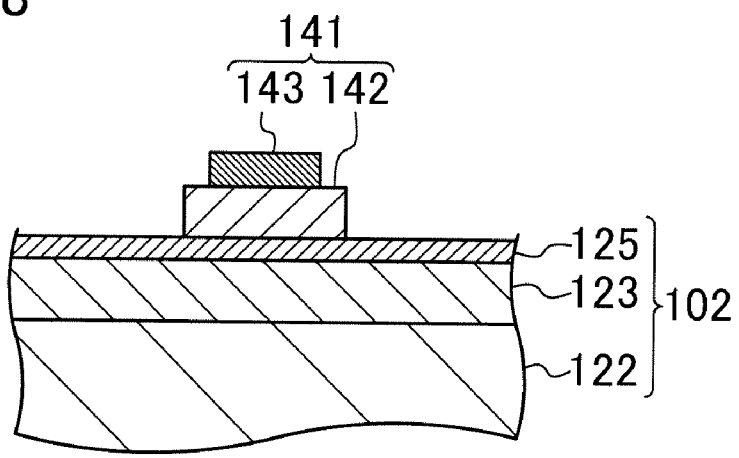
FIG. 18 is a cross-sectional view showing the structure of a hole injection portion of the FET according to the embodiment.

The fourth nitride semiconductor layer 124 may have the same composition and thickness as the third nitride semiconductor layer 142. This enables the fourth nitride semiconductor layer 124 to be formed in the same step as the third nitride semiconductor layer 123. However, in order to reduce an increase in turn-on voltage, it is preferable to form the hole injection portion 141 so that the supply of holes, which is provided from the third nitride semiconductor layer 142 when no voltage is applied to the hole injection electrode 143, is as small as possible. Thus, the impurity concentration in the third nitride semiconductor layer 142 may be lower than that in the fourth nitride semiconductor layer 124, and/or the thickness of the third nitride semiconductor layer 142 may be smaller than that of the fourth nitride semiconductor layer 124. It is preferable that the third nitride semiconductor layer 142 do not have a recess structure even when the fourth nitride semiconductor layer 124 has a recess structure. However, the third nitride semiconductor layer 142 may have a recess structure if required on-resistance can be achieved. In the case where the fifth nitride semiconductor layer 125 is formed, the third nitride semiconductor layer 142 may be formed on the fifth nitride semiconductor layer 125, as shown in FIG. 18.

As described above, the field effect transistor of the present invention is a field effect transistor using nitride semiconductors, in which current collapse is reduced, and is useful as a power transistor that is used for inverters, power supply circuits, etc.

What is claimed is:

1. A field effect transistor, comprising:
a semiconductor stack formed on a substrate, and having a first nitride semiconductor layer, and a second nitride semiconductor layer formed on the first nitride semiconductor layer and having a wider bandgap than that of the first nitride semiconductor layer;
a source electrode and a drain electrode, which are formed on the semiconductor stack so as to be separated from each other;
a gate electrode formed between the source electrode and the drain electrode so as to be separated from the source electrode and the drain electrode; and
a hole injection portion formed on the semiconductor stack at a position closer to the drain electrode than to the gate electrode, wherein
the hole injection portion has a p-type third nitride semiconductor layer, and a hole injection electrode formed on the third nitride semiconductor layer, and
the hole injection electrode and the drain electrode have substantially a same potential.

2. The field effect transistor of claim 1, wherein
the drain electrode is formed between the gate electrode and the hole injection portion.

3. The field effect transistor of claim 1, wherein
the hole injection portion is formed between the drain electrode and the gate electrode.

4. The field effect transistor of claim 1. wherein
the hole injection portion is formed so as to surround the drain electrode.

5. The field effect transistor of claim 1, wherein
the third nitride semiconductor layer has a plurality of island-shaped portions that are formed so as to be separated from each other, and
the hole injection electrode is formed so as to extend over the plurality of island-shaped portions.

6. The field effect transistor of claim 5, wherein
a ratio of a length of a side of each of the island-shaped portions, which faces the drain electrode, to a gap between the island-shaped portions is less than 1.

7. The field effect transistor of claim 5, wherein
a ratio of a length of a side of each of the island-shaped portions, which faces the drain electrode, to a gap between the island-shaped portions is equal to or larger than 1.

8. The field effect transistor of claim 1, wherein
a side surface of the third nitride semiconductor layer is in contact with a side surface of the drain electrode.

9. The field effect transistor of claim 1, wherein
the semiconductor stack has an element region, and an element isolation region that surrounds the element region, and
the drain electrode is connected to the hole injection electrode over the element isolation region.

10. The field effect transistor of claim 1, wherein
the semiconductor stack has an element region, and an element isolation region that surrounds the element region, and
the drain electrode is connected to the hole injection electrode over the element region.

11. The field effect transistor of claim 10, further comprising:
a drain electrode pad formed over the element isolation region; and
a drain electrode interconnect that connects the drain electrode pad to the drain electrode and the hole injection electrode, wherein the drain electrode interconnect is formed so as to extend over the drain electrode and the hole injection electrode, and the drain electrode is connected to the hole injection electrode via the drain electrode interconnect.

12. The field effect transistor of claim 1, wherein the second nitride semiconductor layer is formed so as to have a smaller thickness below the gate electrode than below the third nitride semiconductor layer.

13. The field effect transistor of claim 1, wherein the gate electrode forms a Schottky contact with the second nitride semiconductor layer.

14. The field effect transistor of claim 1, further comprising:

a gate insulating film formed between the gate electrode and the second nitride semiconductor layer.

15. The field effect transistor of claim 1, further comprising:

a p-type fourth nitride semiconductor layer formed between the gate electrode and the second nitride semiconductor layer.

* * * * *